(12) United States Patent
Kim

(10) Patent No.: US 7,645,680 B2
(45) Date of Patent: Jan. 12, 2010

(54) METHOD OF MANUFACTURING ISOLATION LAYER PATTERN IN A SEMICONDUCTOR DEVICE AND ISOLATION LAYER PATTERN USING THE SAME

(75) Inventor: Chang Nam Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 182 days.

(21) Appl. No.: 11/553,978

(22) Filed: Oct. 27, 2006

(65) Prior Publication Data
US 2007/0099393 A1    May 3, 2007

(30) Foreign Application Priority Data
Oct. 28, 2005   (KR) ..................... 10-2005-0102292

(51) Int. Cl.
*H01L 21/76* (2006.01)
(52) U.S. Cl. .............. 438/439; 438/400; 257/E21.545
(58) Field of Classification Search ............. 438/400, 438/439; 257/E21.545
See application file for complete search history.

(56) References Cited

U.S. PATENT DOCUMENTS

| | | | |
|---|---|---|---|
| 7,279,399 B2 * | 10/2007 | Williams et al. | 438/450 |
| 2006/0006462 A1 * | 1/2006 | Chang et al. | 257/341 |
| 2006/0148207 A1 * | 7/2006 | Kim | 438/439 |

* cited by examiner

*Primary Examiner*—Bradley K Smith
(74) *Attorney, Agent, or Firm*—Sherr & Vaughn, PLLC

(57) ABSTRACT

Disclosed is a method of manufacturing an isolation layer pattern in a semiconductor device and an isolation layer pattern in a semiconductor device. A device at a low voltage device formation region may be substantially immune to electric fields from a high voltage device formation region. A field insulation film pattern in a low voltage device formation region (e.g. a logic region) may implement a relatively small design rule at an isolation layer pattern. A method of manufacturing an isolation layer pattern in a semiconductor device (e.g. which may embody a device relatively immune to an electric field from a high voltage device formation region) may include field insulation film patterns with a relatively small design rule in a low voltage device formation region (e.g. a logic region).

17 Claims, 5 Drawing Sheets

METHOD OF MANUFACTURING ISOLATION LAYER PATTERN IN A SEMICONDUCTOR DEVICE AND ISOLATION LAYER PATTERN USING THE SAME

The present application claims priority under 35 U.S.C. 119 and 35 U.S.C. 365 to Korean Application No. 10-2005-0102292 (filed on Oct. 28, 2005), which is hereby incorporated by reference in its entirety.

BACKGROUND

Methods of dispersing an electric field may be significant in analog high voltage processes and/or high power processes. When electrically isolating semiconductor devices use a field oxide film, leakage currents and/or breakdown due to biasing of an electric field may produce complications.

Analog high voltage processes may electrically isolate logic devices from each other and protects logic devices from electric fields applied to a drain extension region of a high voltage device. Method of manufacturing isolation layer patterns in semiconductor devices using LOCOS processes may be implemented.

As illustrated in FIGS. 1A through 1CA, semiconductor substrates may be divided into high voltage device formation region HV and low voltage device formation region LV. An active region and an isolation region may be formed in high voltage device formation region HV and low voltage device formation region LV. Pad oxide film 11 may be formed over semiconductor substrate 10. Pad nitride film 12 may be formed over pad oxide film 11. A photo resist layer may be coated over pad nitride film 12. A photo resist layer may be patterned (e.g. by a photo process such as a photographic process and a developing process) to form photo resist pattern 13 over pad nitride film 12. First isolation region 14a and second isolation region 14b may have openings at high voltage device formation region HV and at low voltage device formation region LV with the same size.

As illustrated in FIG. 1B, pad nitride film 12 may be patterned using photo resist layer pattern 13 as an etch mask to expose pad oxide film 11 at first isolation region 14a and second isolation region 14b. As illustrated in FIG. 1C, pad oxide film 11 may be oxidized by an oxidizing process to form first field oxide film pattern 15a and second field oxide film pattern 15b at first isolation region 14a and second isolation region 14b. A "bird's beak" formation may be formed at each edge of first field oxide firm pattern 15a and second field oxide film pattern 15b. First field oxide film pattern 15a and second field oxide film pattern 15b may have substantially the same shape and/or same size. Photo resist layer pattern 13 may be removed. A transistor for a high voltage device may be formed at high voltage device formation region HV. A transistor for a low voltage device may be formed at low voltage device formation region LV.

When forming a first field oxide film pattern in a high voltage device formation region and a second field oxide film pattern in a low voltage device formation region that have substantially the same size and shape, complication may arise. For example, a low voltage device which requires a relatively small design rule may be compromised by second field oxide film pattern having a relatively large size.

SUMMARY

Embodiments relate to a method of manufacturing an isolation layer pattern in a semiconductor device and an isolation layer pattern in a semiconductor device. In embodiments, a device at a low voltage device formation region may be substantially immune to electric fields from a high voltage device formation region. In embodiments, a field insulation film pattern in a low voltage device formation region (e.g. a logic region) may implement a relatively small design rule at an isolation layer pattern. A method of manufacturing an isolation layer pattern in a semiconductor device (e.g. which may embody a device relatively immune to an electric field from a high voltage device formation region) may include field insulation film patterns with a relatively small design rule in a low voltage device formation region (e.g. a logic region), in accordance with embodiments.

Embodiments relate to a method of manufacturing an isolation layer pattern in a semiconductor device comprising: depositing first and second insulation films on a semiconductor substrate having a high voltage device formation region and a low voltage device formation region; patterning the second insulation film to form a second insulation film pattern in the high and low voltage device formation regions, the second insulation film including a first opening and a second opening with different slopes with respect to the second insulation film for exposing the first insulation film; and oxidizing the first insulation film exposed by the first and second openings.

Embodiments relate to a semiconductor device comprising: a semiconductor substrate having a high voltage device formation region and a low voltage device formation region; an insulation film for covering the semiconductor device; a first field insulation film formed at the high voltage device formation region of the insulation film and has a first bird's beak; and a second field insulation film formed at the low voltage device formation region of the insulation film and has a second bird's beak.

BRIEF DESCRIPTION OF THE DRAWINGS

Example

Example

DETAILED DESCRIPTION

In aspects of the semiconductor industry there is a demand for SoC to reduce the costs and the size of products. For example, there is a demand for a structure including analog processes and devices with logic components. It may be difficult to block noise from logic components and to integrate high power processes. A SoC concept of integrating logic components with the analog high voltage process technology may be desirable. Methods of efficiently integrating logic components with high voltage or high power processes may result in cost reductions and may optimize characteristics of devices, which may be foundation to expand analog SoC technology. If a low voltage logic process is simultaneously implemented with a high voltage logic process, in order to reduce a design rule, the low voltage logic process may implement an LOCOS process having a relatively small bird's beak. To adequately disperse an electric field, an analog high voltage process may implement a LOCOS process having a smooth bird's beak.

When a grade is less than 0.25 μm, logic components may be optimized by a shallow trench isolation (STI) process in consideration of narrow width effects and small geometry effects. There may be obstacles in process technique development for analog high voltage processes. A high voltage or a high power process may reduce an electric field at a junction by using a LOCOS process having a smooth edge. An electric field effect at an edge of a LOCOS may be reduced to produce a stable device current leakage, reliability, and/or safe operation area (SOA) aspects. For an analog SoC, high voltage elements and logic elements may be integrated together. To optimize analog high voltage elements and logic elements, there may be optimization of a LOCOS process. In embodiments, a dual bird's beak LOCOS process may be implemented. A stable high voltage device may be obtained by reducing a design rule in logic elements which may result in reduced costs and/or an LOCOS structure having a smooth bird's beak in high voltage elements. Embodiments relate to a dual bird's beak LOCOS process using a dual slope structure in order to manufacture an LOCOS structure having at least two bird's beaks.

Example FIGS. 2A through 2F are cross-sectional views illustrated a method of manufacturing an isolation layer pattern in a semiconductor device, in accordance with embodiments. A semiconductor substrate may have high voltage device formation region HV and low voltage device formation region LV. High voltage device formation region HV and low voltage device formation region LV may have an active region and an isolation region.

Figure 1A:
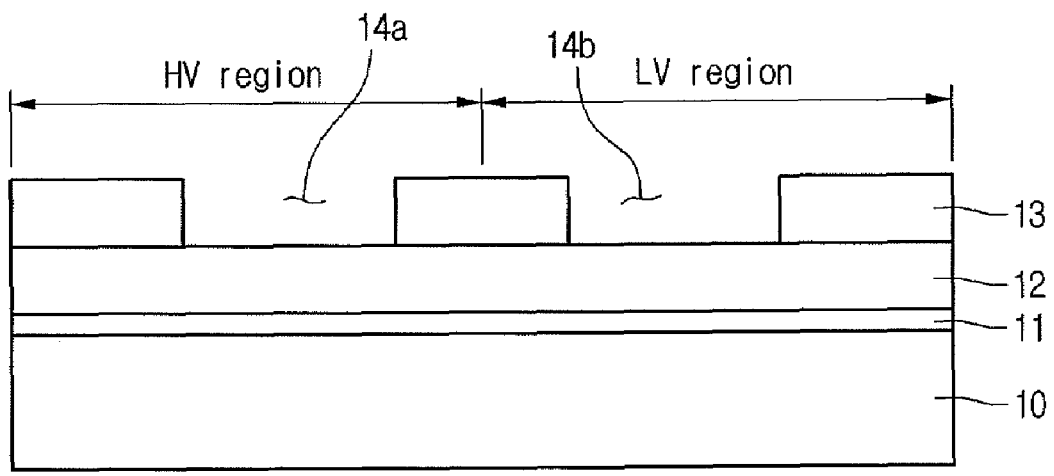
FIGS. 1A through 1C are cross-sectional views illustrating manufacturing of an isolation layer pattern in a semiconductor device.
Figure 1B:
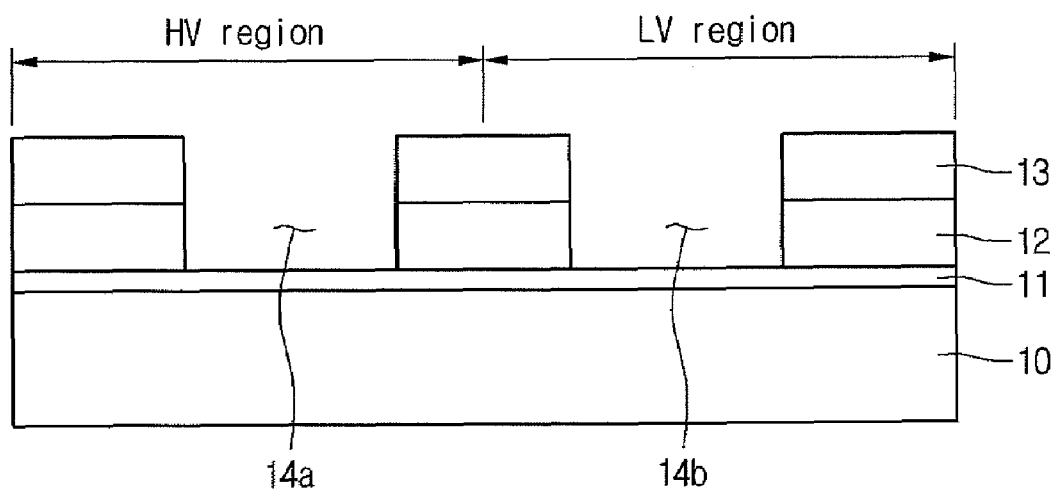
Figure 1C:
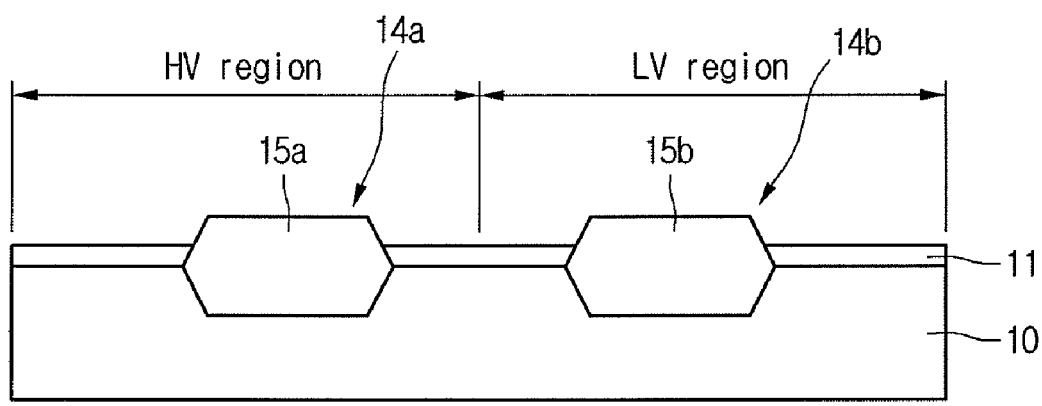
Figure 2A:
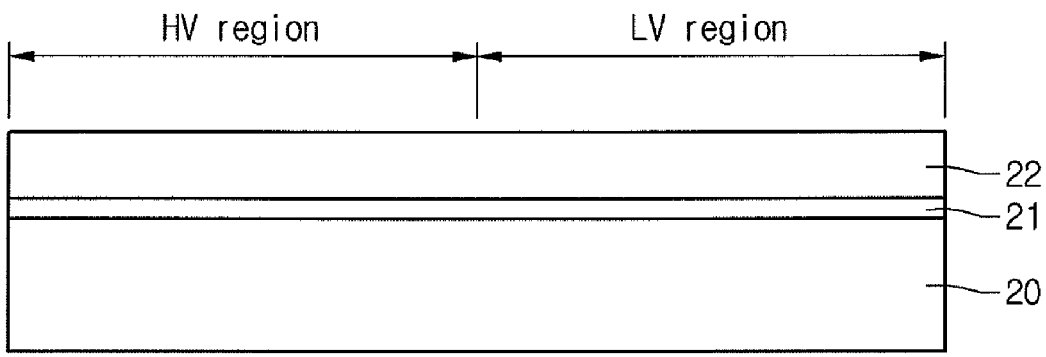
FIGS. 2A through 2F are cross-sectional views illustrating a method of manufacturing an isolation layer pattern in a semiconductor device, according to embodiments.

As illustrated in FIG. 2A, first insulation film 21 and second insulation film 22 may be formed on semiconductor substrate 20, in accordance with embodiments. Semiconductor substrate 20 may have high voltage device formation region HV and low voltage device formation region LV. In embodiments, first insulation film 21 may be formed on semiconductor substrate 20 and second insulation film 22 may be formed on first insulation film 21. In embodiments, first insulation film 21 (e.g. a thin film) may include an oxide film. In embodiments, second insulation film 22 (e.g. a thin film) may include a nitride film.

Figure 2B:
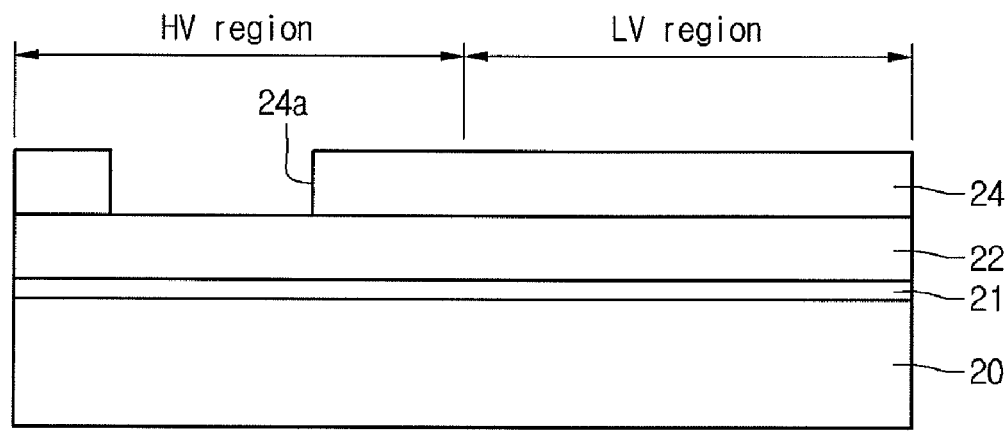

As illustrated in FIG. 2B, after first insulation film 21 and second insulation film 22 are formed on semiconductor substrate 20, a first photo resist layer may be coated on second insulation film 22, in accordance with embodiments. In embodiments, a first photo resist layer may be formed of a photosensitive substance. In embodiments, a first photo resist layer may be formed by a spin coating process. A first photo layer may patterned by a photo process (e.g. a photographic process and a developing process) to form first photo resist layer pattern 24. First photo resist layer pattern 24 may have opening portion 24a exposing second insulation film 22 in high voltage device formation region HV.

Figure 2C:
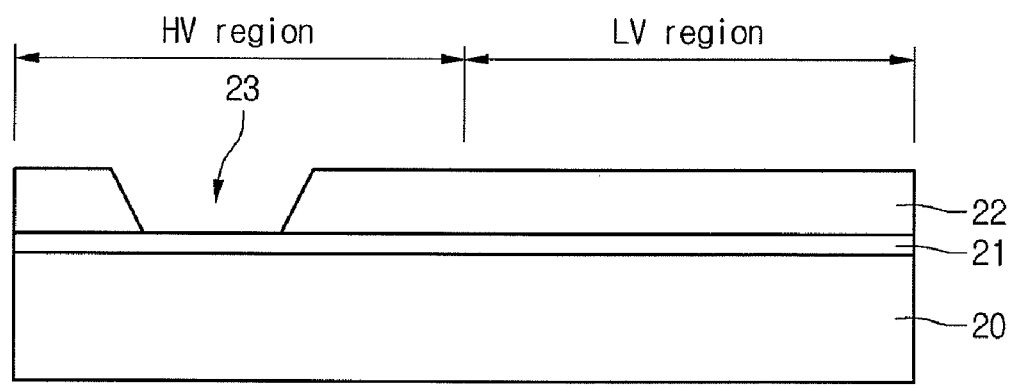

As illustrated in FIG. 2C, second insulation film 22 may be wet or dry-etched using first photo resist layer pattern 24 as an etch mask to form first opening 23, in accordance with embodiments. First opening 23 may expose a portion of first insulation film 21 in high voltage device formation region HV. A slope of a surface of first opening 23 may have a positive slope in relation to an upper surface of first insulation film 21. An external angle of an upper surface of first insulation film 21 and an external angle of the slope of first opening 23 of second insulation film 22 may be formed at obtuse angles. In embodiments, upon forming first opening 23 of second insulation film 22, an etch condition may allow polymers to be formed. First photo resist layer 24 may be removed from second insulation film 22.

Figure 2D:
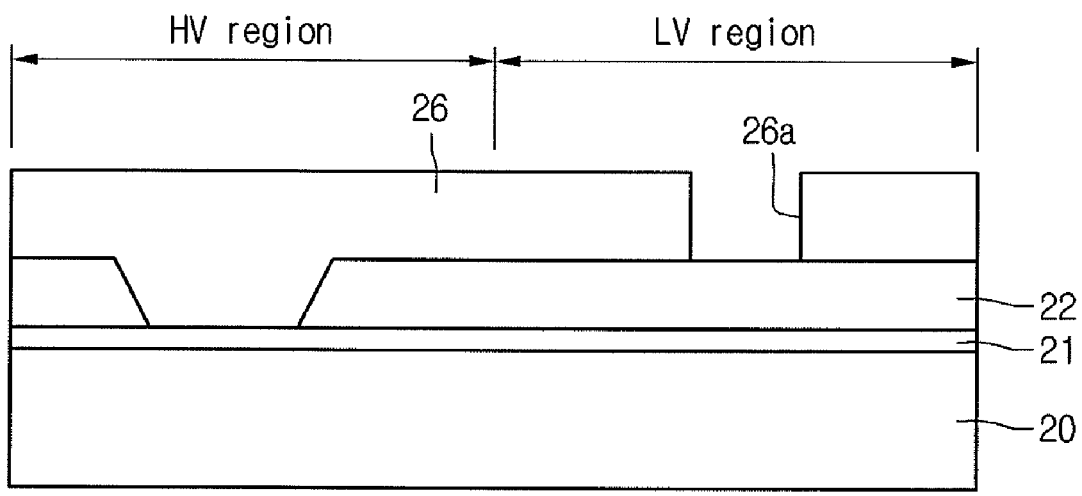

As illustrated in FIG. 2D, first photo resist layer pattern 24 may be removed from second insulation film 22, in accordance with embodiments. A second photo resist layer may be coated on second insulation film 22. Second insulation firm 22 may include first opening 23. First opening 23 may have a slope surface that exposes a portion of high voltage device formation region HV. In embodiments, second photo resist layer may be formed by a spin coating process (or similar process). A second photo layer may be patterned by a photo process (e.g. a photographic process and a developing process) to form second photo resist layer pattern 26 having opening portion 26a which exposes a portion of first insulation film 21 at low voltage device formation region LV.

Figure 2E:
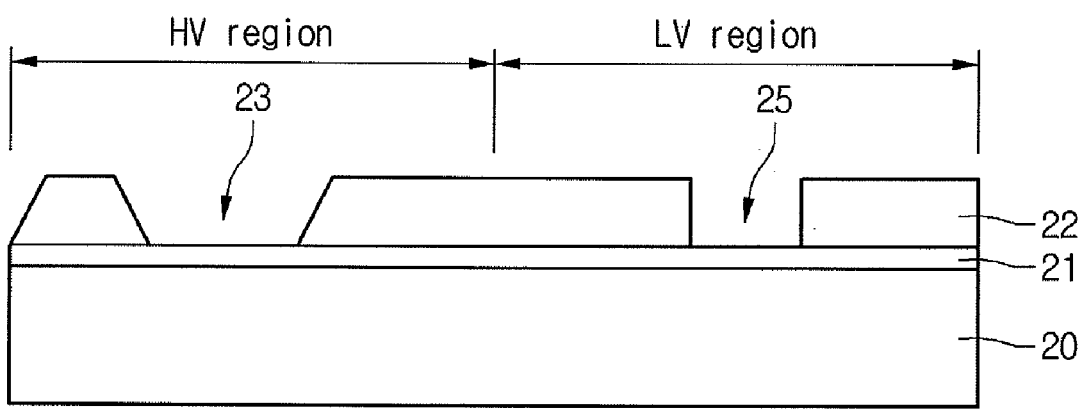

As illustrated in FIG. 2E, second insulation film 22 may be etched substantially perpendicular to a surface of first insulation film 21, in accordance with embodiments. Second photo resist layer pattern 26 may be used as an etch mask to form second opening 25 at second insulation film 22. Second photo resist layer pattern 26 may be removed from second insulation film 22. In embodiments, a side wall of second opening 25 may be formed out of second insulation film 22. A side wall of first opening 23 may be formed out of second insulation 25 having different angles (with respect to an upper surface of first insulation film 21) from second opening 25, in accordance with embodiments.

Figure 2F:
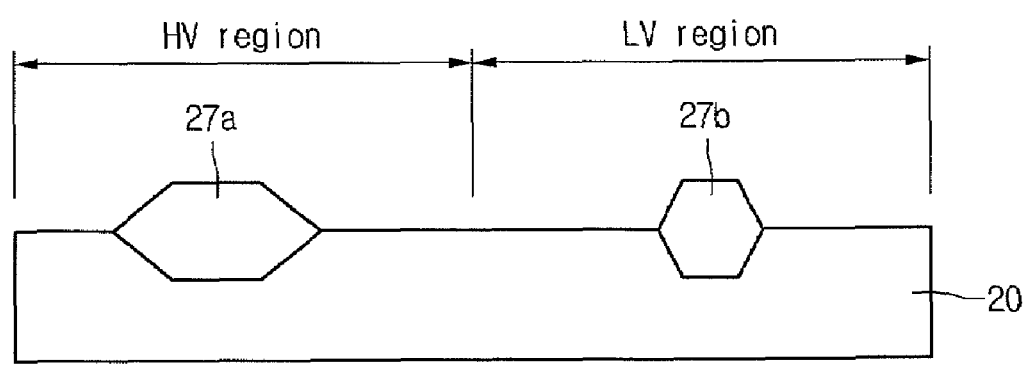

As illustrated in FIG. 2F, first insulation film 21 may be oxidized at first opening 23 and second opening 25 to form a field insulation film 27a and a second field insulation film 27b, in accordance with embodiments. In embodiments, a first bird's beak may be formed at an edge of first field insulation film 27a and a second bird's beak may be formed at second field insulation film 27b. In embodiments, first field insulation film 27a with a first bird's beak may be formed in high voltage device formation region HV. In embodiments, second field insulation film 27b with a second bird's beak may be formed in low voltage device formation region LV.

A first bird's beak of first field insulation film 27a may form a first slope angle with respect to an upper surface of first insulation film 21. A second bird's beak of a second field insulation film 27b may form a second slope angle with respect to an upper surface of first insulation film 21. In embodiments, the angle of the second bird's beak may be greater than the angle of the first bird's beak. In embodiments, the second bird's beak is smaller than the first bird's beak. In embodiments, second field insulation film 27a having a second bird's beak has a size that is relatively small compared to first field insulation film 27b having a first bird's beak.

Second insulation 22 may be removed from first insulation film (e.g. by a wet etch process). A transistor of a high voltage device may be formed at an active region of high voltage device formation region HV. A transistor of a low voltage device may be formed at a low voltage device formation region LV. A transistor of a high voltage device and a transistor of a low voltage device may be formed simultaneously, in accordance with embodiments. A first bird's beak of first field insulation film 27a may be formed at high voltage device formation region HV with a smooth slope, in accordance with embodiments. A second bird's beak of second field insulation film 27b may have a size that is less than a bird's beak of the first field insulation film 27a, in accordance with embodiments. In embodiments, an isolation region having two bird's beaks of different sizes may be formed.

In embodiments, an isolation layer pattern in a semiconductor device includes a semiconductor substrate, insulation film 21, first field insulation film 27a, and second insulation film 27b. In embodiments, a semiconductor substrate includes high voltage device formation region HV and low voltage device formation region LV. An insulation film may covers a semiconductor substrate having high voltage device formation region HV and low voltage device formation region LV. First field insulation film 27a may be formed at high voltage device formation region HV of the insulation film and have a first size. Second field insulation film 27b may be formed at low voltage device formation region LV and may have a second size. In embodiments, the second size may be less than the first size.

A first bird's beak may be formed at an edge of first field insulation film 27a and may have a first slope angle with respect to an upper surface of insulation film 21. A second bird's beak may be formed at an edge of the second field insulation film 27b and may have a second slope angle. In embodiments, the second slope angle may be greater than the first slope angle with respect to the insulation film 21.

First field insulation film 27a may have a first width due to a first bird's beak. Second field insulation film 27b may have a second width due to a second bird's beak. In embodiments, the second width may be less than the first width (e.g. due to a greater slope angle of the first bird's beak). In embodiments, a relatively small design rule may be applied to low voltage device formation region LV having the second field insulation film 27b to form a low voltage semiconductor device.

In embodiments, a bird's beak having a smooth slope at high voltage device formation region HV may be included in a device that is substantially immune from electric field interference. A size of a bird's beak may be minimized at low voltage device formation region LV to reduce a design rule, in accordance with embodiments.

It will be obvious and apparent to those skilled in the art that various modifications and variations can be made in the embodiments disclosed. Thus, it is intended that the disclosed embodiments covers the obvious and apparent modifications and variations, provided that they are within the scope of the appended claims and their equivalents.

What is claimed is:

1. A method comprising:
   depositing a first insulation film and a second insulation film over a semiconductor substrate, wherein the semiconductor substrate comprises a high voltage device formation region and a low voltage device formation region, wherein the first insulating film and the second insulating film are respectively deposited in the high voltage device formation region and the low voltage device formation region using a single deposition process;
   patterning the second insulation film to form a second insulation film pattern in the high voltage device formation region and the low voltage device formation region to form a first opening and a second opening, wherein the first opening and the second opening have different slopes with respect to the second insulation film and the first opening and the second opening expose the first insulation film; and
   oxidizing the first insulation film at the first opening and the second opening.

2. The method of claim 1, wherein the first insulation film is formed of an oxide film.

3. The method of claim 1, wherein the second insulation film is formed of a nitride film.

4. The method of claim 1, wherein said forming the first opening comprises:
   forming a first photoresist pattern over the second insulation film; and
   forming the first opening by etching a portion of the high voltage device region of the second insulation film using the first photoresist pattern as a mask, wherein the first opening has a first slope with respect to an upper surface of the first insulation film.

5. The method of claim 4, wherein said forming the second opening comprises:
   forming a second photoresist over the second insulation film; and
   forming the second opening by etching a potion of the low voltage device region of the second insulation film using the second photoresist pattern as the mask, wherein the second opening is substantially perpendicular to the upper surface of the first insulation film.

6. The method of claim 5, wherein said forming the first opening comprises etching the second insulation film to form the first opening at a slope using process conditions that generate polymers.

7. The method of claim 1, wherein said oxidizing the first insulation film comprises:
   forming a first field insulation film having a first bird's beak at a first region of the second insulation film corresponding to the first opening; and
   forming a second field insulation film having a second bird's beak at a second region of the second insulation film corresponding to the second opening.

8. The method of claim 7, wherein:
   the first bird's beak has a first slope angle with respect to an upper surface of the first insulation film;
   the second bird's beak has a second slope angle with respect to an upper surface of the first insulation film; and
   the second slope angle is greater than the first slope angle.

9. The method according to claim 7, wherein:
   the first bird's beak has a first size;
   the second bird's beak has a second size; and
   the second size is less than the first size.

10. A method comprising:
    sequentially forming a first insulation film and a second insulation film over a semiconductor substrate having a high voltage device formation region and a low voltage device formation region, wherein the first insulating film and the second insulating film are respectively formed in the high voltage device formation region and the low voltage device formation region using a single deposition process;
    forming a first opening in the second insulation film exposing the first insulation film at the high voltage device formation region and a second opening in the second insulation film exposing the first insulation film at the low voltage device formation region, wherein the first opening and the second opening have different slopes with respect to the second insulation film;
    oxidizing the first insulation film at the first opening to form a first field insulation film having a first bird's beak; and then
    oxidizing the first insulation film at the second opening to form a second field insulation film having a second bird's beak.

11. The method of claim 10, wherein:
    the first bird's beak is formed at an edge of the first field insulation film and has a first slope angle with respect to the upper surface of the first insulation film;
    the second bird's beak is formed at an edge of the second field insulation film and has a second slope angle with respect to the upper surface of the first insulation film; and
    the second slope angle is greater than the first slope angle.

12. The method of claim 10, wherein:
    the first field insulation film has a first width;
    the second field insulation film has a second width; and
    the second width is less than the first width.

13. A method comprising:
providing a semiconductor substrate having a high voltage device formation region and a low voltage device formation region;
depositing a first insulation film using a single deposition process in the high voltage device formation region and the low voltage device formation region;
depositing a second insulation film using a single deposition process in the high voltage device formation region and the low voltage device formation region after depositing the first insulating film;
exposing a first portion of the first insulating film by forming a first opening having a first slope angle in the second insulation film and at the high voltage device formation region;
exposing a second portion of the first insulating film by forming a second opening having a second slope angle in the second insulation film and at the low voltage device formation region to expose the first insulation film after forming the first opening;
forming a first field insulation film at the first opening and a second field insulation film at the second opening by oxidizing the first insulation film,
wherein the first slope angle is different than the second slope angle.

14. The method of claim 13, wherein the first insulation film comprises an oxide film.

15. The method of claim 14, wherein the second insulation film comprises a nitride film.

16. The method of claim 13, wherein exposing the first portion of the first insulating film comprises:
forming a first photoresist pattern over the second insulation film;
forming the first opening by etching a portion of the second insulation film using the first photoresist pattern as a mask; and
removing the first photoresist pattern.

17. The method of claim 16, wherein exposing the second portion of the first insulating film comprises:
forming a second photoresist over the second insulation film; and
forming the second opening by etching a portion of the second insulation film using the second photoresist pattern as the mask.

* * * * *